United States Patent [19]

Ozaki

[11] Patent Number: 4,543,659

[45] Date of Patent: Sep. 24, 1985

[54] METHOD FOR RECOGNIZING A PELLET PATTERN

[75] Inventor: Takayuki Ozaki, Hyogo, Japan

[73] Assignee: Tokyo Shibaura Denki Kabushiki Kaisha, Japan

[21] Appl. No.: 534,496

[22] Filed: Sep. 21, 1983

[30] Foreign Application Priority Data

Sep. 22, 1982 [JP] Japan .................. 57-163827

[51] Int. Cl.$^4$ .............................. G06K 9/00
[52] U.S. Cl. ........................ 382/8; 356/398; 356/237
[58] Field of Search ............... 356/237, 398; 364/490, 364/491; 358/101, 106, 107; 382/8; 209/509, 643, 939, 572, 571

[56] References Cited

U.S. PATENT DOCUMENTS 3,617,744 11/1971 Irish .................... 356/398
3,909,602 9/1975 Micka .................. 356/237
4,496,056 1/1985 Schoenig, Jr. et al. ....... 356/398

FOREIGN PATENT DOCUMENTS 57-68042 4/1982 Japan .

OTHER PUBLICATIONS

A Preprint of Lectures: 80' Internepkon Japan; Semiconductor Exhibit Hironaka et al., "Introduction of a Pattern Recognition System into a Semiconductor Bonding Step," Jan. 1982.

Primary Examiner—Leo H. Boudreau
Assistant Examiner—Michael M. Murray
Attorney, Agent, or Firm—Finnegan, Henderson, Farabow, Garrett & Dunner

[57] ABSTRACT

In a pellet pattern recognition method, a pellet pattern recognition apparatus is used which includes a table for determining a pellet pick-up priority order, pellet memory table for storing data of good and bad pellets as well as data representing an "already picked-up" state and a "not picked-up" state, and position memory table for storing a positional shift of each of the good pellets within a pellet pattern recognition range away from the picked-up pellet. When the good pellets are to be sequentially picked up, the shape identification and position detection of the pellets within the pellet pattern recognition range are effected by calculating the correlation coefficients. In this case, calculation is performed with respect to the pellet array on the basis of the results of the shape identification and position detection and initially set reference data, and the good pellet is stored, as the corresponding coordinate data, in the pellet memory table.

7 Claims, 8 Drawing Figures

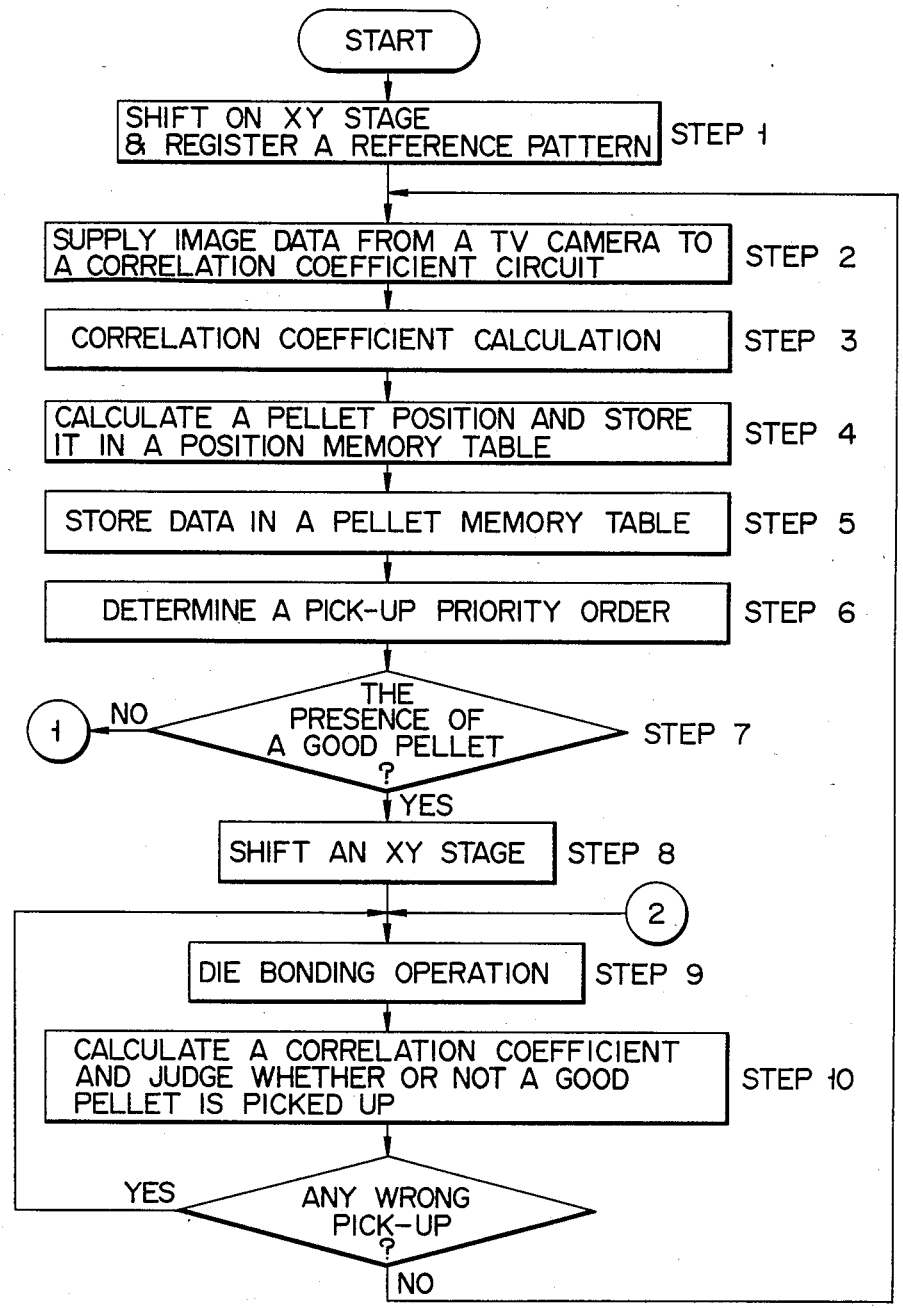

F I G. 4
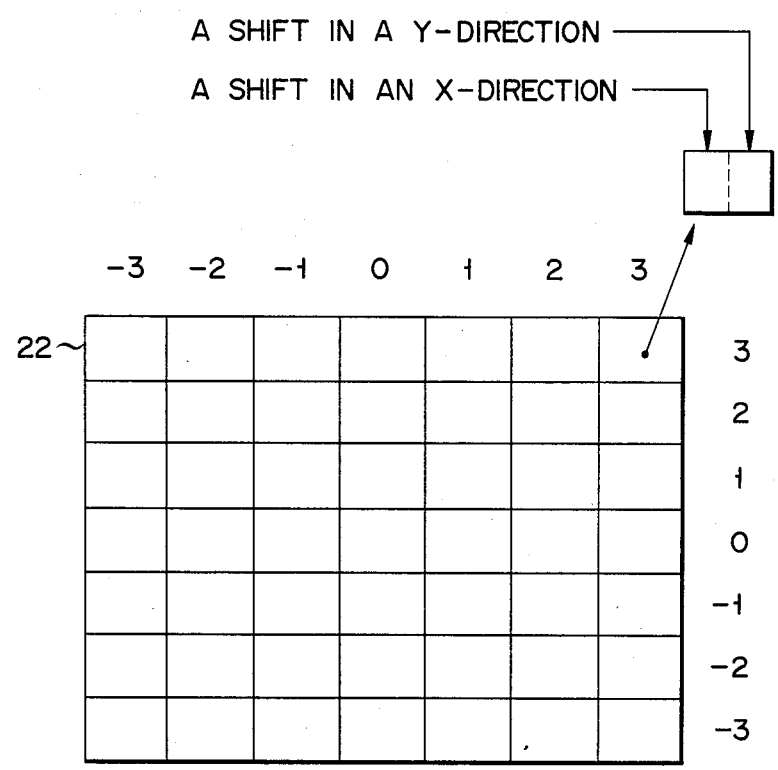

| 12 | 9 | 6 | 3 |  |  |  |
|---|---|---|---|---|---|---|
| 11 | 8 | 5 | 2 |  |  |  |
| 10 | 7 | 4 | 1 |  |  |  |
| 16 | 15 | 14 | 13 |  |  |  |
|  |  |  |  |  |  |  |

24L

|  |  |  | 3 | 6 | 9 | 12 |
|---|---|---|---|---|---|---|
|  |  |  | 2 | 5 | 8 | 11 |
|  |  | 1 | 4 | 7 | 10 |  |
|  |  |  | 13 | 14 | 15 | 16 |
|  |  |  |  |  |  |  |

24R

METHOD FOR RECOGNIZING A PELLET PATTERN

BACKGROUND OF THE INVENTION

This invention relates to a method for recognizing a pellet pattern in the manufacture of a semiconductor device, and, in particular, a pellet pattern recognition method applied to a die-bonding operation effected after a good pellet is sequentially picked up from among pellets divided, as well as to a test operation using a prober.

Generally, during the manufacture of a semiconductor device, a die bonding step is carried out by placing a number of pellets (dies) having semiconductor elements on an XY stage of a die bonder and bonding a good pellet picked up from among the pellets to a proper position of a lead frame. The pellets on the XY stage are arranged in a matrix array with some distance left in the lateral direction and a direction perpendicular thereto, as set out below. A wafer on which semiconductor elements have been formed is bonded to a bonding sheet and then cut along a dicing line into a number of rectangular pellets. The bonding sheet is stretched in the lateral direction and a direction perpendicular thereto with some distance left between the dies and fixed on the surface of the XY stage. The shape identification is effected with respect to each pellet on the surface of the XY stage. Where the pellet is judged as being good, the position detection and pick-up of it are carried out. Where, on the other hand, the pellet is judged as being bad, it is not picked up and the XY stage is then shifted to pattern-recognize another pellet in a sequential fashion. Since all the pellets are sequentially pattern-recognized one by one, the efficiency of the die bonding operation is lowered dependent upon the number of bad pellets. The speed of the bonding operation varies due to a variation in the number of bad pellets, thus obtaining no high quality of bonding. Furthermore, the array of the pellets is disturbed and during the sequential pick-up of the pellets the pellet on one row may be displaced on another row with the result that more good pellets are left behind. In order to shift the XY stage to another pellet row subsequent to the termination of the pattern recognition for one row, a means such as an edge sensor is required to detect the outer edge of the wafer. A greater demand is made for a pellet pattern recognition method in which only good pellets can be efficiently and sequentially picked up one by one from among a number of good and bad pellets whose array is somewhat disturbed. Since the conventional method cannot perform an effective pick-up operation, there exists a problem of a lowering in the operational efficiency and in the quality of products. Furthermore, more good pellets are left behind. A solution to such problems is attempted to permit the complete automation of the manufacturing step of a semiconductor device.

SUMMARY OF THE INVENTION

One object of this invention is to provide a pellet pattern recognition method capable of efficiently picking up only good pellets from among a number of pellets including bad pellets.

Another object of this invention is to provide a pellet pattern recognition method which can pick up good pellets irrespective of the shape of the pellets and the disturbance of a pellet array with the good pellets hardly left behind.

A pellet pattern recognition method of this invention comprises the steps of registering a good-pellet pattern as a reference pattern on a reference pattern table; setting a pellet pattern recognition range on the pellets in a matrix array, effecting the shape identification and position detection of the pellets present within the pellet pattern recognition range; effecting calculation with respect to the pellet array on the basis of the results of the shape identification and position detection of the pellets present within the pellet pattern recognition range to find array data of the pellets; picking up a good pellet from among the pellets present within the pellet pattern recognition range, according to the data of the pellet pick-up priority table; registering the good pellet other than the picked-up good pellet as a coordinate value on a pellet memory table; registering the good pellet, other than the picked-up pellet, within the pellet pattern recognition range as a positional shift of it away from the position of the picked-up pellet; and sequentially picking up only the good pellet, while referring to the pick-up priority order table, pellet memory table and position memory table.

Since according to the pellet pattern recognition method of this invention only the good pellets are sequentially picked up, a high-speed die bonding can be performed with almost no loss time, permitting the die bonding operation to be effected at a uniform speed as well as permitting a possible thermal deterioration of the pellet to be controlled. Furthermore, a drop in yield due to a possible disturbance in the array of the pellets occurs and good pellets are hardly left behind. When a pellet pick-up step is shifted to the next line in the pellet array, it is not necessary to detect the other edge of the wafer. According to this invention, a general-purpose die bonding device can be constructed irrespective of the shapes of the pellets and wafer.

BRIEF DESCRIPTION OF THE DRAWINGS

FIGS. 3A and 3B show a flow chart for explaining the operation of the die bonding apparatus of FIG. 1;

FIG. 4 is a view for explaining a position memory table for storing the position of the pellets of FIG. 1;

DETAILED DESCRIPTION OF THE PREFERRED EMBODIMENTS

Figure 1:
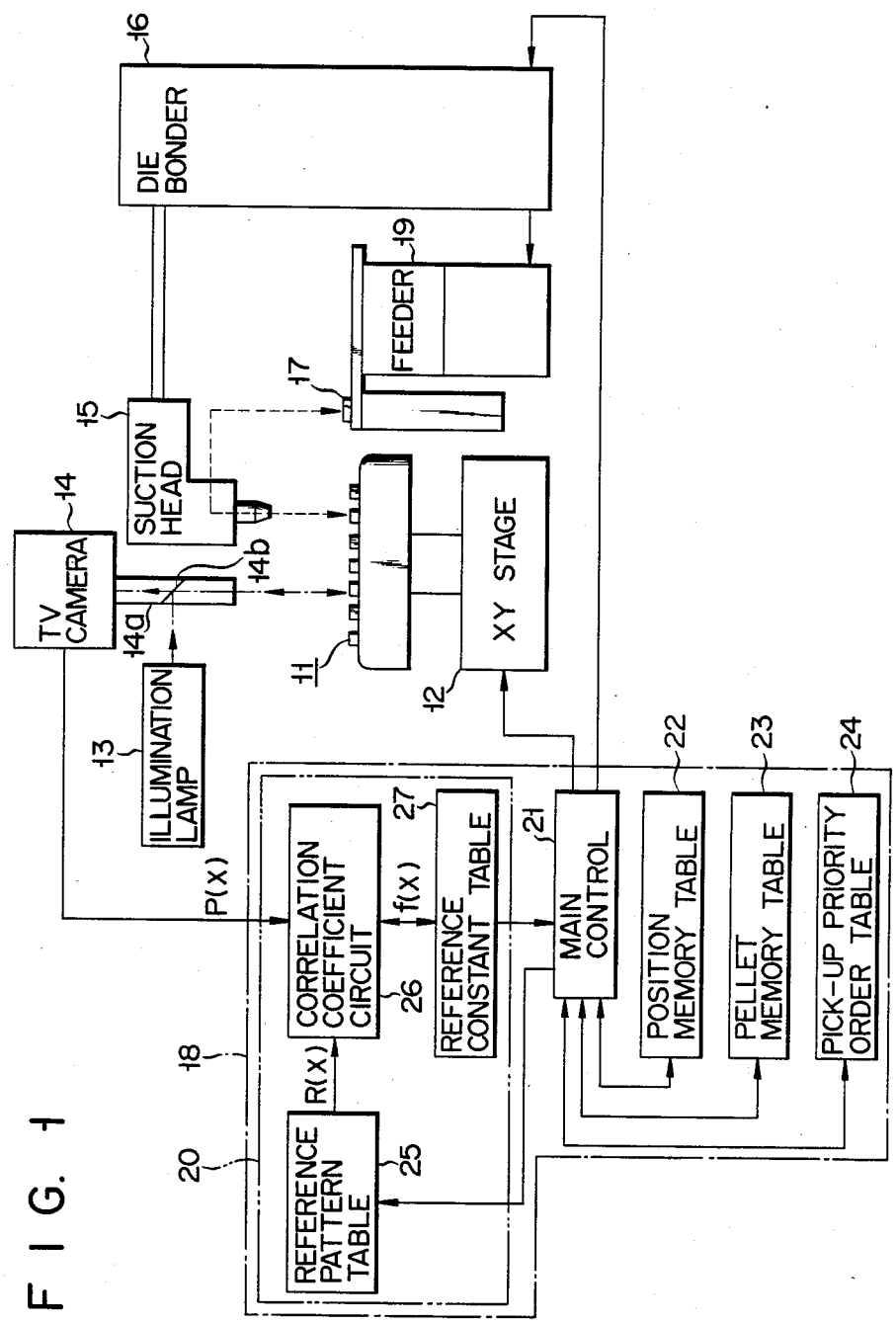
FIG. 1 is a diagrammatic view showing a die bonding apparatus to which is applied a pellet pattern recognition method according to an aspect of this invention.
Figure 2:
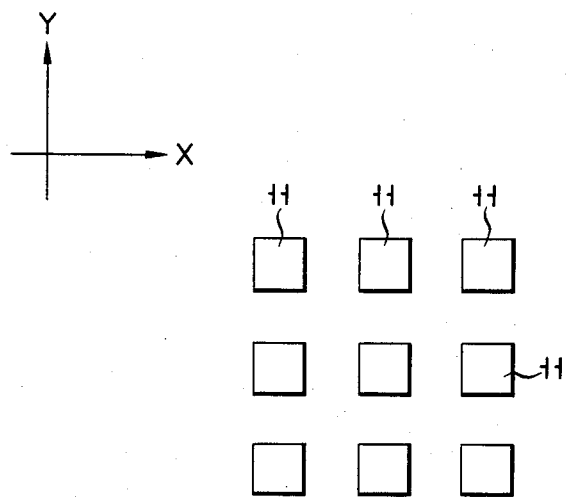
FIG. 2 is a view for explaining the array state of pellets of FIG. 1.

FIG. 1 shows a die bonding apparatus to which is applied a pellet pattern recognition method of this invention. A group of pellets 11 is located on an XY stage 12 such that they are movable in the X, Y directions. As shown in FIG. 2, the pellets 11 are arranged in a matrix array in the X, Y directions with some distance left therebetween. The pellet is illuminated by an illumination lamp 13. That is, light emitted from the illumination lamp 13 is reflected on a half mirror 14b of a lens section 14a of an industrial television camera 14 and then illuminates the pellet 11. The light reflected by the pellet is directed through the half mirror 14b and lens section 14a to the television camera 14 to permit the images of the pellets 11 to be picked up therein. The pellet selected from among the pellet array is picked up by the suction head 15. The pellet 11 picked up by the suction head 15 is bonded to a predetermined position of a lead frame 17 by a die bonder 16. The XY stage 12 and die bonder 16 are controlled by a control section 18 on the basis of image data obtained from the television camera 14 and thus the suction head 15 and feeder 19 are controlled by the die bonder 16. The control section 18 includes a pattern recognition section 20 for recognizing the pellet pattern on the basis of the pellet image data supplied from the television camera 14, a main control section 21 comprised of, for example, a microcomputer for effecting various controls on the basis of the data supplied from the pattern recognition section 20, a position memory table 22, pellet memory table 23 and a pick-up priority order table 24. The pattern recognition section 20 includes a reference pattern table 25 for storing the reference pattern of the pellet, an array processor-equipped correlation coefficient circuit 26 for calculating the coefficient of a correlation between the reference pattern registered on the reference pattern table 25 and the image data supplied from the television camera 14 and for identifying the pellet for its size and detecting the position of the pellet, and a reference constant pattern 27 for calculating the array data of pellets from the shape identification and position detection on the basis of the output of the correlation coefficient circuit 26.

Figure 3B:
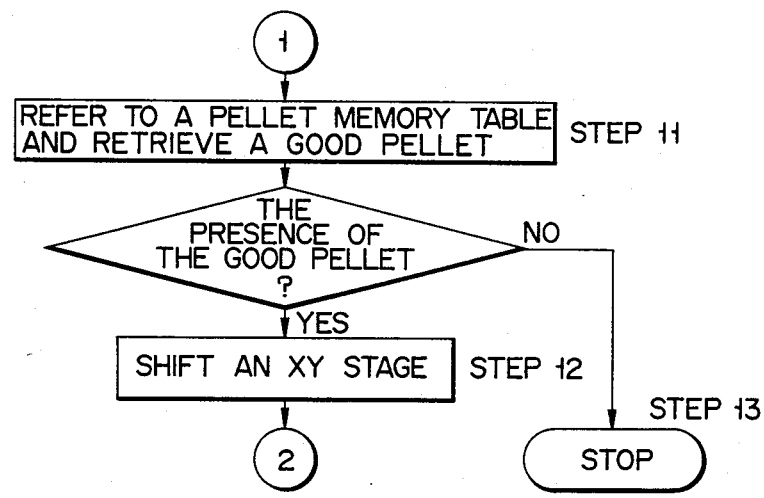
Figures 5, 6A, 6B:
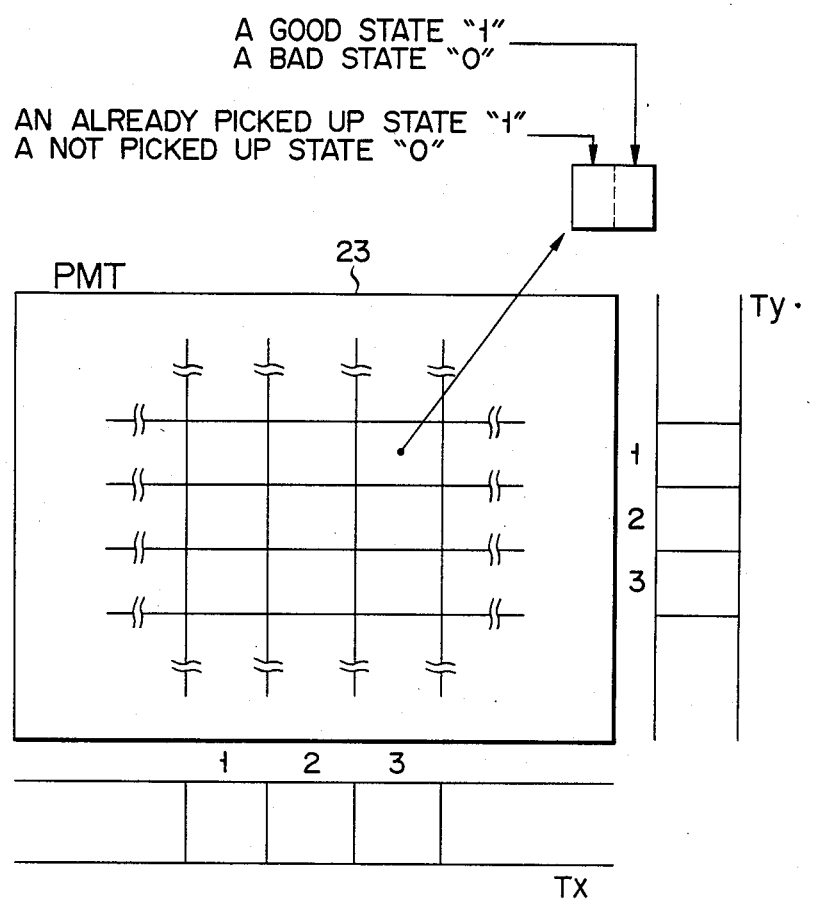
FIG. 5 is a view for explaining a pellet memory table of FIG. 1.
FIGS. 6A and 6B are views for explaining a priority order table of FIG. 1.

The operation of the apparatus will be explained below by referring to the flow charts of FIGS. 3A and 3B and the respective tables of FIGS. 4 and 5 and FIGS. 6A and 6B.

The XY stage 12 is shifted to permit the visual detection of a good pellet in the group and the detected pellet pattern is registered in the reference pattern table 25 (step 1). When the XY stage 12 is driven by the main control unit 21 so that a pellet recognition range is set, the image of the pellets within the recognition range is picked up by the television camera 14 and image input data P(x)—an analog signal or a digital signal—obtained from the television camera 14 is supplied to the correlation coefficient circuit (step 2). Reference data R(x) registered on the reference pattern table 25 to provide a basis for pattern detection is supplied to the correlation coefficient circuit 26, and the correlation function f(x) between the reference data R(x) and the image input data P(x) is calculated on the following equation (1)—step 3.

$$f(x) = \frac{\int P(x) \cdot R(x)dx - \frac{1}{k} \int P(x)dx \cdot \int R(x)dx}{\sqrt{\int (P(x))^2 dx - \frac{1}{k} \{\int P(x)dx\}^2} \cdot \sqrt{\int R(x)^2 dx - \frac{1}{k} \{\int R(x)dx\}^2}} \quad (1)$$

where k: an integration range.

The correlation function f(x) obtained from the equation (1) is in a value range of +1 to −1 and shows the degree of a coincidence with a maximum reference pattern at a value of +1. This permits the shape identification and position detection of the pellets 11. A good pellet is judged according to the shape identification performed based on the calculation of the correlation coefficient f(x) and the position of the judged pellet only is stored as the position data in the position memory table 22 as shown in FIG. 4 (step 4). At this time, with the position of the pellet registered on the reference pattern table 25 as the reference position (0, 0), a positional shift of the good pellet in the X and Y directions with respect to the reference position is stored in the position memory table 22. Now suppose that a pellet adjacent to a right side pellet registered on the reference pattern table 24 is a good pellet. In this case, the positional shift of the good pellet in the X and Y directions with respect to a reference position (1, 0) is stored in the position memory table 22. When "0" is involved with respect to the good pellet, it is stored in the pellet memory table 23 of FIG. 5, meaning that the pellet is not yet picked up. When, on the other hand, "1" is involved with respect to the good pellet, it is stored in the pellet memory table 23, meaning that the pellet has already been picked up as set out below. When the correlation coefficient is greater than a "good/bad" judging reference value, "1" is stored as a good pellet in the pellet memory table 23 and when it is smaller than a "good/bad" judging reference value "0" is stored as a bad pellet in the pellet memory table 23. The coordinate values of the good pellet are found by adding present XY coordinate values of the XY stage 12 and an amount of positional shift of the pellet with respect to the reference pellet and registered in the X and Y coordinates Tx and Ty of the pellet memory table 23 (step 5).

At steps 3 to 5, the state of the pellet array is calculated by an array processor in the correlation coefficient circuit 26. Here, calculation is effected based on the reference pellet array data registered on the reference constant table 27 and image input data P(x) input from the television camera 14, thus preparing a correlation coefficient matrix. That is, the correlation coefficients are rearranged in the decreasing order such that each is combined with the corresponding position data where the corresponding coefficient is located. In this way, the greatest coefficient and position data are registered. The pick-up priority order is determined by the priority order tables 24L, 24R of FIGS. 6A and 6B. Now suppose that the pellets are picked up to the left of the tables of FIGS. 6A and 6B. The pick-up priority order of the pellets (1, 2, . . . , 16) is set in a numerical order according to the pick-up priority order data. Where all the pellets on the left side table 24L are picked up, the pellets on the table 24R are retrieved according to the pick-up order of the priority order table 24R of FIG. 6B (step 7). Where there exist any pellets on the side of the table 24R, the XY stage 12 is shifted to the pick-up position according to the pick-up priority order (step 8). The pellet is picked up by the suction head 15 and die-bonded to the predetermined position of the lead frame 17 (step 9). Calculation is again made with respect to the correlation coefficient to see whether or not there exists any pick-up error (step 10). If the answer is in the affirmative, the process goes back to step 9. At this step, the die-bonding is performed after the pellet is picked up. If a normal die-bonding operation is effected, the process goes back to step 2 and the next pellet recognition range is set followed by the repetition of the same steps.

Where at step 7 the pellet is not found in the corresponding position, another pellet is retrieved, while reference is made to the pellet memory table 23 (step 11). Where there exists any good pellet, the XY stage 12 is moved from the present position to the nearest position of a good pellet (step 12). In the absence of any good pellets, the bonding operation is completed (step 13).

When the processing operation is completed with respect to the pellets 11 by the repetitive operation of the steps, the position data and array data of the good pellet only are stored in the position memory table 22 of FIG. 4. The coordinate value of the good pellet and a flag representing the good pellet, as well as the pick-up states ("already picked up" and "not yet picked up" states) are stored in the pellet memory table 23 and the subsequent pick-up operation is performed based on the data of the tables 22 and 23.

Where the good pellet is picked up, a flag "1" representing the "picked up" state is raised on the pellet memory table 23 of FIG. 4, preventing that pellet from being picked up at a later step. Where the pellet fails to be picked up due to a nonuniformed bonding strength in spite of a few pick-up operations attempted, the state of the pellet memory table 22 may be changed to the flag "1", interrupting and inhibiting the pick-up operation of the pellet at the subsequent step.

With the die-bonding apparatus using the pellet pattern recognition method of this invention, the pellet shape identification and position detection are effected based on the calculation of the correlation coefficients and, in this case, the input data is normalized in the calculation of the correlation coefficient. As a result, an adequate allowance is provided with respect to a change in a signal amplitude corresponding to the intensity of the pattern image and in a DC component corresponding to lightness. It is therefore unnecessary to convert the data involved to binary data. Theoretically, the apparatus using the method of this invention has a noise margin, because an area from which noise is produced is divided by a whole area defined in the pellet recognition range of the pellet pattern during the calculation of the correlation coefficient. In consequence, the pattern detection efficiency can be improved with added stability. Furthermore, the pattern processing time can be reduced by reducing the image input data supplied to the correlation coefficient circuit 26 and contriving the calculation method.

A method for effecting the shape identification and position detection by a correlation coefficient circuit 26 is disclosed in more detail in Japanese Patent Disclosure (Kokai) No. 57-137978 corresponding to Japanese Patent Application No. 56-23868—the inventor the same as that of this application.

With the die-bonding apparatus to which the pellet pattern recognition apparatus is applied, the good pellet is effectively picked up, while referring to the pellet memory table 23 for storing all of the already recognized good pellets and the position memory table 22 for storing those good pellets within the pellet pattern recognition range. Stated in more detail, the good pellet is picked up, while referring to the pick-up priority table 24, pellet memory table 23 for storing, as the coordinate values, all the good pellets outside the recognition range and position memory table 22 for storing the positional shift of the good pellet within the recognition range away from the picked-up pellet. This method prevents a transfer of the picked-up pellet to a wrong position due to, for example, the disturbance of the pellet array, whereby an effective die-bonding operation can be realized with a lesser number of the good pellets left behind.

What is claimed is:

1. A method for recognizing a pellet pattern, comprising the steps of:
    (a) registering a good-pellet pattern, as a reference pattern, on a reference pattern table;
    (b) setting a pellet pattern recognition range on the pellets in an array;
    (c) effecting shape identification and position detection of each of the pellets present within the pellet pattern recognition range;
    (d) effecting calculation with respect to a pellet array on the basis of the results of the shape identification and position detection of the pellets within the pellet pattern recognition range and reference data of the reference pattern table to find an array state indicating which pellets within the pellet patern recognition range are good pellets;
    (e) picking up a good pellet from among the pellets present within the pellet pattern recognition range, according to data of a pick-up priority order table;
    (f) registering the coordinate values of another good pellet other than the picked-up pellet on a pellet memory table during the pick-up of the good pellet;
    (g) registering each of the good pellets, other than the picked-up good pellet, within the pellet pattern recognition range on a position memory table as a positional shift of it away from the position of the picked-up pellet; and
    (h) sequentially picking up only the good pellets, while referring to the pick-up priority order table, pellet memory table and position memory table.

2. A method of claim 1, wherein the step (c) is performed by calculating a correlation coefficient of image input data and the initially stored reference pattern.

3. A method of claim 2, wherein the step (d) is performed by arranging coefficient values of a correlation coefficient matrix in a decreasing value order with a position of a picked-up pellet of a maximum coefficient value as a reference.

4. A method of claim 1, wherein the step (e) is performed such that the pick-up direction and row are controlled by the position data of the pick-up priority order table and the position memory table.

5. A method of claim 1, wherein when no good pellets exist within the pellet pattern recognition range a pellet pattern recognition range is again set on a previous pellet array area in connection with the coordinate values corresponding to the pellets judged good at a previous step and on the basis of the good pellet data stored in the pellet memory table.

6. A method of claim 1, wherein when no good pellets exist in the pellet pattern recognition range and in the pellet memory table the pick-up operation is terminated.

7. A method of claim 1, wherein when a good pellet cannot be picked up in spite of the pick-up operation the corresponding data in the pellet memory table is treated as being already picked up and the pick-up of the corresponding pellet is inhibited in a subsequent step.

* * * * *